United States Patent [19]

Sequeira et al.

[11] Patent Number: 4,853,613

[45] Date of Patent: Aug. 1, 1989

[54] CALIBRATION METHOD FOR APPARATUS EVALUATING MICROWAVE/MILLIMETER WAVE CIRCUITS

[75] Inventors: Hermann B. Sequeira; Michael W. Trippe, both of Baltimore; Rajendra S. Jakhete, Catonsville, all of Md.

[73] Assignee: Martin Marietta Corporation, Bethesda, Md.

[21] Appl. No.: 113,110

[22] Filed: Oct. 27, 1987

[51] Int. Cl.[4] ............................................. G01R 27/04
[52] U.S. Cl. .............................. 324/58 R; 324/58 A; 324/58 B
[58] Field of Search ............. 364/518, 571; 324/58 R, 324/58 A, 58 B, 58.5 R, 58.5 A, 58.5 B

[56] References Cited

U.S. PATENT DOCUMENTS

| 4,680,538 | 7/1987 | Dalman | 324/58 B |
| 4,721,901 | 1/1988 | Ashley | 324/58 B |

OTHER PUBLICATIONS

Hewlett–Packard product Note 8510-5: "Specifying Calibration Standards for the HP8510"–Mar. 1986.
Franzen: "A New Procedure for System Calibration . . . "–5th European Microwave Conference–Sep. 1975.

Primary Examiner—Reinhard J. Eisenzopf
Assistant Examiner—Jose M. Solis
Attorney, Agent, or Firm—James B. Eisel; Gay Chin

[57] ABSTRACT

A calibration procedure for vector network analyzers utilizing a known standard, an unknown standard and a pair of offsets bearing a known length ratio (2:1) between them whereby measurements taken on the standards and their combinations with the offsets result in self-verifying redundant equations which furnish: (1) error terms according to well-known flow graph models, (2) the reflection of the unknown standard, (3) the transmission factor of the waveguiding medium from which the offsets are realized regardless of the waveguide's loss or dispersion, and (4) a figure of merit (corruption coefficient) for the quality of the acquired raw data without the necessity for computing the error terms, connecting verification standards or otherwise completing the calibration process.

17 Claims, 12 Drawing Sheets

CALIBRATION METHOD FOR APPARATUS EVALUATING MICROWAVE/MILLIMETER WAVE CIRCUITS

BACKGROUND OF THE INVENTION

This invention relates to a calibration method and more particularly to a method for calibrating apparatus, such as a vector network analyzer, utilized for making evaluations of circuits operating at microwave and millimeter wave frequencies.

Most calibration methods used for electronic measurement apparatus require the use of a set of extremely high quality standards whose characteristics are known in advance. Additionally, a well known standard must be connected to verify the calibration procedure. Before any vector network analyzer system utilized for measuring the characteristic of devices can be used, it must be calibrated to remove any systematic errors in the measurement hardware. Accordingly, conventional calibration techniques at microwave or millimeter wave frequencies demand the fabrication of precise short circuits, open circuits and matched loads which need to be fabricated to exacting tolerances, not easily achieved. Moreover, such methods are inhibited by dispersion in the transmission medium, for example, microstrip, slotline, coplanar line, coplanar strips, etc. in which the measurement is performed. These dispersion characteristics are often unknown in millimeter wave integrated circuit devices thereby further compounding measurement difficulty. Also, the integrity of the operation hinges very critically on whether ideal electrical characteristics are reproduced at the launch plane for every calibration and verification device and for the device under test. Thus, conventional techniques do not furnish a convenient method for assessing the uncertainties due to variations in such characteristics.

A typical prior art calibration technique is disclosed in an article entitled, "Calibration of an Automatic Network Analyzer Using Transmission Lines of Unknown Characteristic Impedance, Loss and Dispersion", by E. F. daSilva et al. appearing in *The Radio and Electronics Engineer*, Vol. 48, No. 5, pp. 227-234, May, 1978.

It is an object of this invention, therefore, to provide an improved method for calibrating electronic measurement apparatus.

It is another object of this invention to provide an improved method for calibrating network analyzers for evaluating conventional and integrated circuits operating at microwave and millimeter wave frequencies.

It is still another object of this invention to provide an improved method for calibrating network analyzers by employing measurement redundancy to enhance stability, convergency, and accuracy of the measurements.

It is a further object of this invention to provide a method for calibrating vector network analyzers by utilizing relative characteristics among standards as opposed to their absolute characteristics.

It is yet a further object of this invention to provide a method for calibrating vector network analyzers which yields a direct and convenient measure of calibration quality.

It is still a further object of this invention to provide a self-verifying method for calibrating vector automatic network analyzers.

SUMMARY

Briefly, the foregoing and other objects of this invention are provided by a method which determines the systematic errors associated with millimeter wave vector network analyzers utilized to measure complex reflection and transmission coefficients or impedance characteristics of components and devices used in microwave/millimeter wave waveguides or transmission lines. The method uses redundancy of measurements and relative characteristics to furnish information to indicate the level of non-correctable corruption entering into the calibration procedure due to random errors. Also, as a part of the calibration procedure according to the present invention, there is provided a determination of the propagation properties of the transmission medium such as loss and dispersion.

Ratios of the respective lengths of transmission line offsets coupled to a measurement port of a vector network analyzer provide a means to generate independent measurement conditions without the need for independent high quality standards. The method is thus not restricted by dispersion, losses or the lack of a plurality of high quality standards.

In the illustrated embodiment detailed below, the calibration procedure is controlled by a microprocessor and involves storing data for measurements taken via the network analyzer for a plurality of frequencies swept over a frequency range for six different circuit elements coupled to the measurement port of the vector network analyzer, namely, a load, an offset load, a doubly offset load, a short, an offset short, and a doubly offset short. Neither the offset nor the load need to be known a priori. They are determined by the calibration algorithm which also furnishes the usual error terms i.e. source match, directivity, frequency response tracking, etc. The value of load and/or offset as calculated by the procedure can be compared against an actual measurement of that component by the network analayzer to derive verification of the calibration.

BRIEF DESCRIPTION OF THE DRAWINGS

The objects of the present invention and the attendant advantages thereof will become apparent by reference to the following drawings, wherein.

DETAILED DESCRIPTION

Figure 1:
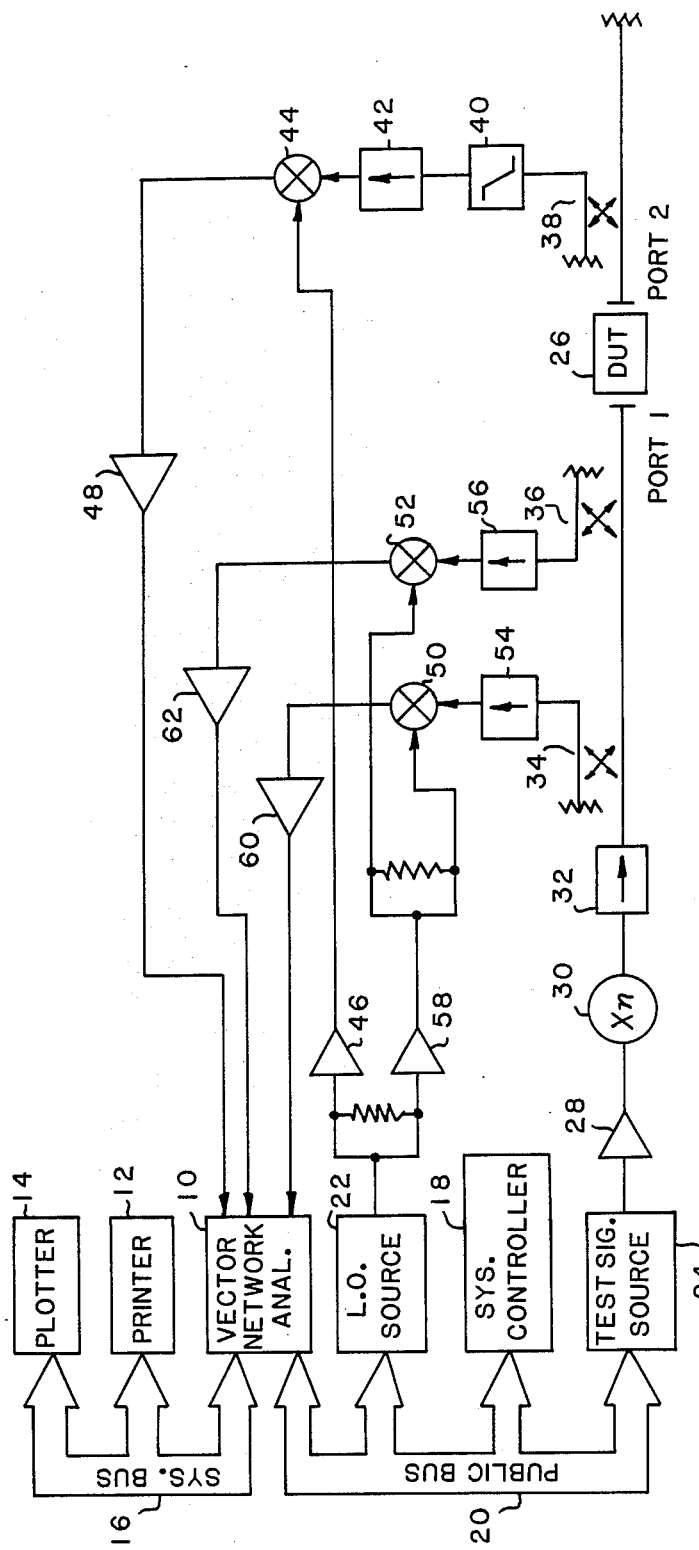
FIG. 1 is an electrical block diagram of a vector network analyzer system utilized in practicing the method according to the subject invention.

Referring now to FIG. 1, there is shown a typical vector network analyzer system for evaluating millimeter wave circuit components and including a vector network analyzer 10 comprising, for example, a Hewlett-Packard HP8510 network analyzer. The vector network analyzer 10 is coupled to a printer 12 and a plotter 14 by means of a digital bus 16 designated a system bus. The network analyzer 10, moreover, is controlled by a system controller 18 comprising a microprocessor. The microprocessor 18 is coupled to the vector network analyzer 10 through a second digital bus termed a public bus which is also connected to a local oscillator source 22 and a test signal source 24 whose frequency and power output is controlled by the microprocessor.

The system as shown comprises a two port network to which is coupled a device under test (DUT) 26. One port, port 1, is coupled to a millimeter wave frequency signal through an amplifier 28 coupled to the test signal source 24 which has been multiplied by a factor of X2 or X3 by a frequency multiplier 30 which is then connected to port 1 through a signal isolator 32 and a pair of millimeter wave signal couplers 34 and 36. The second measurement port, designated port 2, comprises an output port which is coupled back through the vector network analyzer 10 through a third millimeter wave coupler 38, bandpass filter 40, an isolator 42 and a signal mixer 44 The mixer 44 is coupled back to the local oscillator source 22 by means of an amplifier 46. The output of the mixer 44 couples back to the vector network analyzer 10 by way of an amplifier 48. The multiplied output frequency of the test signal source 24 is also fed to a pair of signal mixers 50 and 52 which are respectively coupled to the couplers 34 and 36 via the isolators 54 and 56. Mixers 50 and 52 also receive a local oscillator input from the local oscillator source 22 by way of amplifier 58. The output of the mixers 50 and 52 are coupled back to the vector network analyzer 10 by way of a pair of amplifiers 60 and 62. A typical one port calibration procedure involves connecting a plurality of standards to port 1 whereupon the system operates as a reflectometer.

The system controller includes software which sets the test signal source 24, then the local oscillator source 22 and when the system has settled makes the measurement and plots the data in a user-prescribed format on a CRT screen, not shown, associated with the vector network analyzer 10. This sequence is repeated for each of 51, 101, 201 or 401 points over a selected frequency range in a well known manner for the test apparatus represented in FIG. 1.

Conventional one port calibration methods involving vector network analyzers such as shown in FIG. 1 demand the fabrication of precise short circuits and matched loads, all to exacting tolerances often beyond the reach of current state-of-the-art monolithic fabrication techniques. This also applies to known two-port calibration methods. Further, such techniques are inhibited by dispersion in the transmission medium, e.g., microstrip, slot line, coplanar line, coplanar strips, etc. These dispersion characteristics are often unknown in the integrated circuit environment, thereby further compounding measurement difficulty. Also, the integrity of a calibration of the vector network analyzer hinges very critically on whether identical electrical characteristics are reproduced at the launch plane (Port 1)for every calibration and verification device and for the device under test. Thus, state-of-the-art techniques do not furnish a convenient method for assessing the uncertainties due to variations in such characteristics. Unfortunately, integrated circuit technology is very prone to deficiencies arising from launch plane integrity, thus leading to poor confidence in the quality of calibrations. Finally, the conventional approach of verifying a calibration by inserting a separate verification device assumes good launch plane integrity for the verification standard. This has been found to be a poor assumption for the integrated circuit environment.

The present invention overcomes these limitations by capitalizing on the strengths of integrated circuit fabrication. For example in such fabrication, it is easier to hold parameter ratios to tight tolerances rather than the discrete values of the parameters themselves. This invention, as will be shown, is well suited for such a condition because, as the following example will show, it is based on the use of ratioed lengths of transmission line offsets coupled to the measurement port, i.e. Port 1 of FIG. 1. The algorithm to be described herein furnishes the transmission line's loss and dispersion characteristics as part of the calibration procedure, a decided advantage for integrated circuit evaluation. This invention also reduces the need for simultaneously maintaining extremely tight tolerances over a range of calibration device types. Instead, it can be applied based on a priori knowledge of only one standard type, e.g. a short circuit, so that only the assumed characteristics of this type of standard must be met in production. All the other standards are determined relative to this one standard (short) as part of the calibration procedure, and therefore can have an arbitrary tolerance. For these standards, however, the technique relies on the reproducibility of the integrated circuit environment.

Lastly, this invention integrates calibration and verification to produce three desirable outcomes: (1) a measure of the corruption that entered into the calibration without the necessity of completing the process, (2) a quantitative display of the uncertainty limits for the calibration/verification procedure, and (3) a basis for inserting automation into the calibration process. The first outcome allows the user to abort a given calibration run because of the poor quality of the acquired raw data without ever having to compute the calibration coefficients. The second gives the user an immediate estimate of the quality of the calibration, and the third provides a natural basis for artificial intelligence automation of the procedure so that high throughput, vital for reducing integrated circuit costs, is possible.

As in other known prior art calibration techniques, the method of the subject invention exploits the usual transformation property of a terminated transmission line. More specifically, standard transmission line theory predicts that a load (L) with an inherent reflection coefficient of $\Gamma$ will transform to a reflection coefficient $\Gamma_L$ as:

$$\Gamma_L(l) = \Gamma e^{-2\gamma l} = \Gamma z^- \quad (1)$$

when measured through a length ($l$) of transmission line. In general, all the $\Gamma$s are complex numbers, i.e. having both a magnitude and a phase. As defined above, $z = e^{2\gamma l}$, where $\gamma$ is the complex propagation factor for the transmission line, and $\gamma = \alpha + j\beta$, where $\alpha$ is the line's attenuation constant and $\beta$ is its phase constant.

Figure 2A:
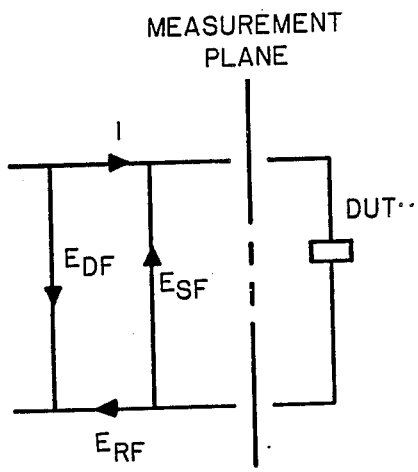
FIGS. 2A and 2B are electrical schematic diagrams illustrative of standard error models for one-port and two-port devices.
Figure 2B:
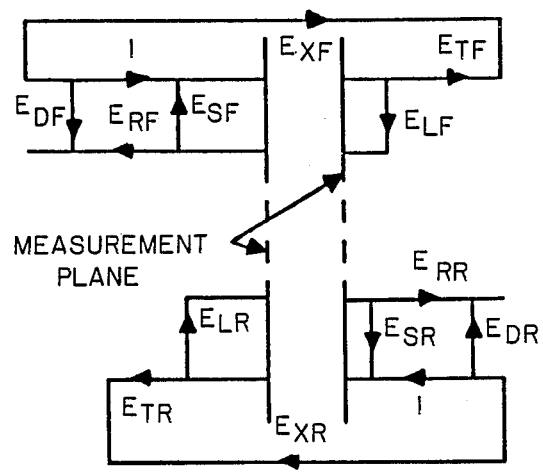

With the foregoing in mind, this invention is based on well known standard error models represented by signal flow graphs (FIGS. 2A and 2B) with coefficients expressed as frequency response tracking $E_R$ or $E_T$, directivity $E_D$, source match or load match $E_S$ or $E_L$ and isolation $E_X$. These error terms are determined by calibration, and are alternatively called calibration coefficients or error coefficients. In addition to these error coefficients the propagation factor z of the transmission line and the reflection coefficient $\Gamma_L$ of at least one other standard such as a load must be determined. Thus, there are five unknowns and, therefore, five independent measurements are needed.

The use of offset lengths of transmission line offers a convenient way to generate independent measurement conditions without the need for independent standard types. For example, adding an offset length ($l$) of transmission line to a short circuit ($\Gamma_{short} = -1$) creates a new measurement of an "offset short", provided the larger offset length is less than a half wavelength at the highest frequency of interest. It must be less than a quarter wavelength if the known standard is a short (open) and the unknown is an open (short). In the present invention technique, two offsets of lengths ($l$) and ($2l$) are used. The ratio of the lengths, i.e, 2:1, is of greater importance to the technique's success than the actual value of ($l$).

If these offset lengths are combined with the short circuit, three measurement conditions are generated which can be concisely represented by the expression:

$$C_{sn} = E_D - \frac{E_R}{z^n + E_s} \quad (2)$$

where $C_{Sn}$ is the raw or measured data value of the reflection coefficient $\Gamma_s = -1$, n=0 corresponds to a short, n=1 corresponds to an offset short, and n=2 corresponds to a doubly-offset short. The flow diagrams of FIGS. 2A and 2B contain the prescription for obtaining the expressions for Equations 2 and 3 as is well known in the art.

A similar expression $C_{Ln}$ can be developed for an arbitrary load that is different from the short and its combination with the same n=1 and n=2 offsets, namely, $$C_{Ln} = E_D + \frac{E_R \Gamma_L}{z^n - E_s \Gamma_L} \quad (3)$$

Expressions (2) and (3) thus provide equations for $C_{S0}$, $C_{S1}$, $C_{S2}$, and $C_{L0}$, $C_{L1}$, $C_{L2}$ which can be used for determining the five above identified unknowns of $E_R$, $E_D$, $E_S$, z, and $\Gamma_L$. However, the six equations may be used to eliminate all the unknowns from the measurement set, so that a relationship can be developed relating to the raw or measured data values only. For the particular case of the instant example, this relationship is:

$$K_L = \frac{K_{LS}^{20}}{K_S} \quad (4)$$

where $$K_L = \frac{C_{L2} - C_{L1}}{C_{L1} - C_{L0}} \quad (5)$$

$$K_{LS}^{20} = \frac{C_{L2} - C_{S2}}{C_{L0} - C_{S0}} \quad (6)$$

$$K_S = \frac{C_{S2} - C_{S1}}{C_{S1} - C_{S0}} \quad (7)$$

Equation (4) forms the basis for defining a corruption factor, $K_{Cor}$ as $$K_{Cor} = K_L - \frac{K_{LS}^{20}}{K_S} \quad (8)$$

If the errors occurring during calibration were solely systematic, then Eq. (4) would be satisfied exactly and $K_{Cor} = 0$.

Figure 3:
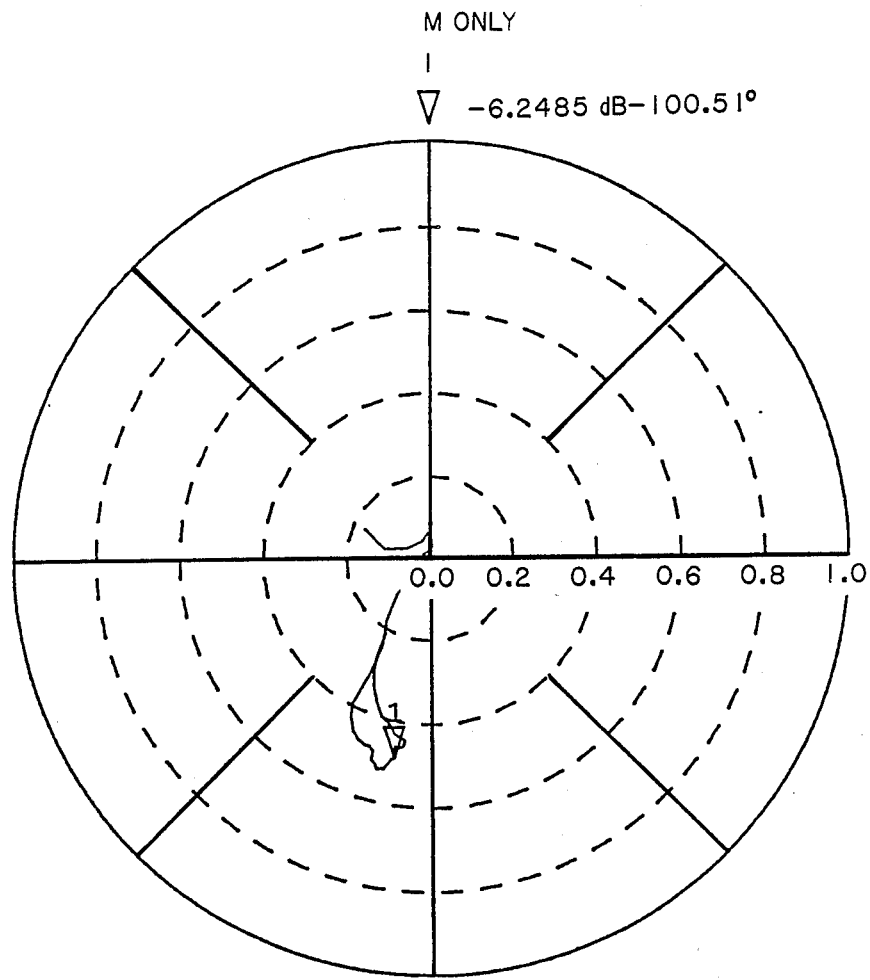
FIG. 3 is a polar representation indicating the corruption factor for a typical calibration run utilizing the apparatus shown in FIG. 1.

In practice, however, non-systematic errors arising from noise, drift, cable stability, connector repeatability, spurious responses, etc., will generally cause $K_{Cor}$ to have a non-zero value. When a calibration was performed on a vector network analyzer system as shown in FIG. 1 and including a Hewlett-Packard (HP) model R11643A Ka-band extender test set in conjunction with a HP 8510A vector network analyzer, the distribution of $K_{Cor}$ over a 26.5 GHz to 30 GHz frequency range on a polar display as shown in FIG. 3 directly indicates the extent to which the integrity of the calibration is compromised. The farther away from the origin the distribution, the poorer the integrity of the calibration.

Figure 4:
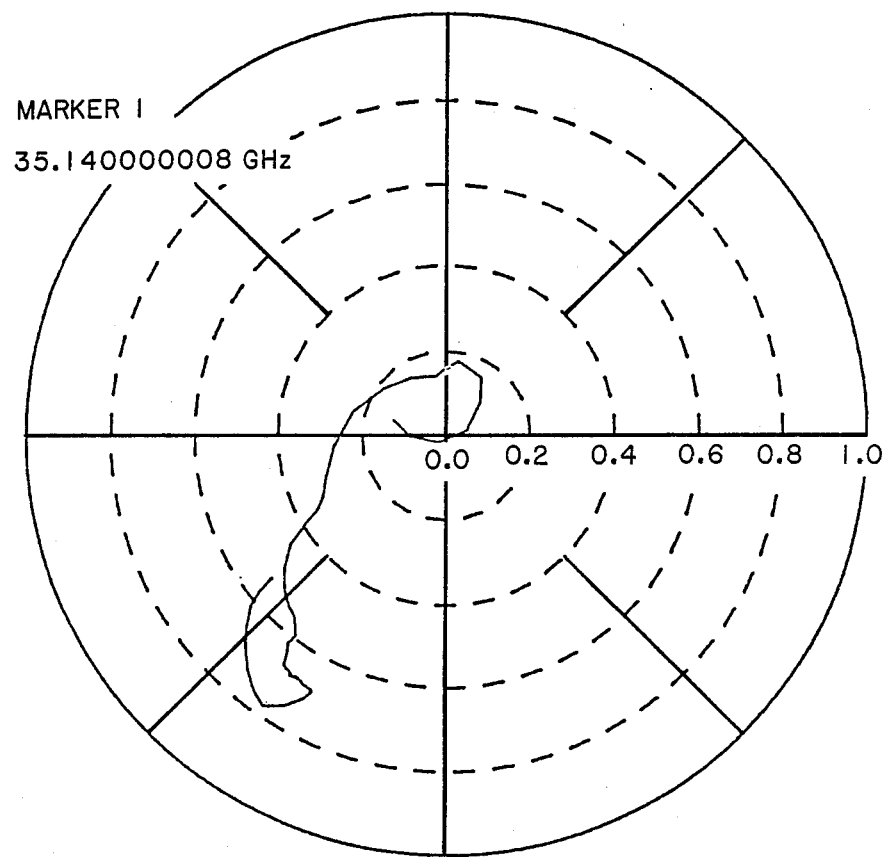
FIG. 4 is a polar representation indicating the corruption factor obtained when time for instrument warm-up was not adequate.
Figure 5:
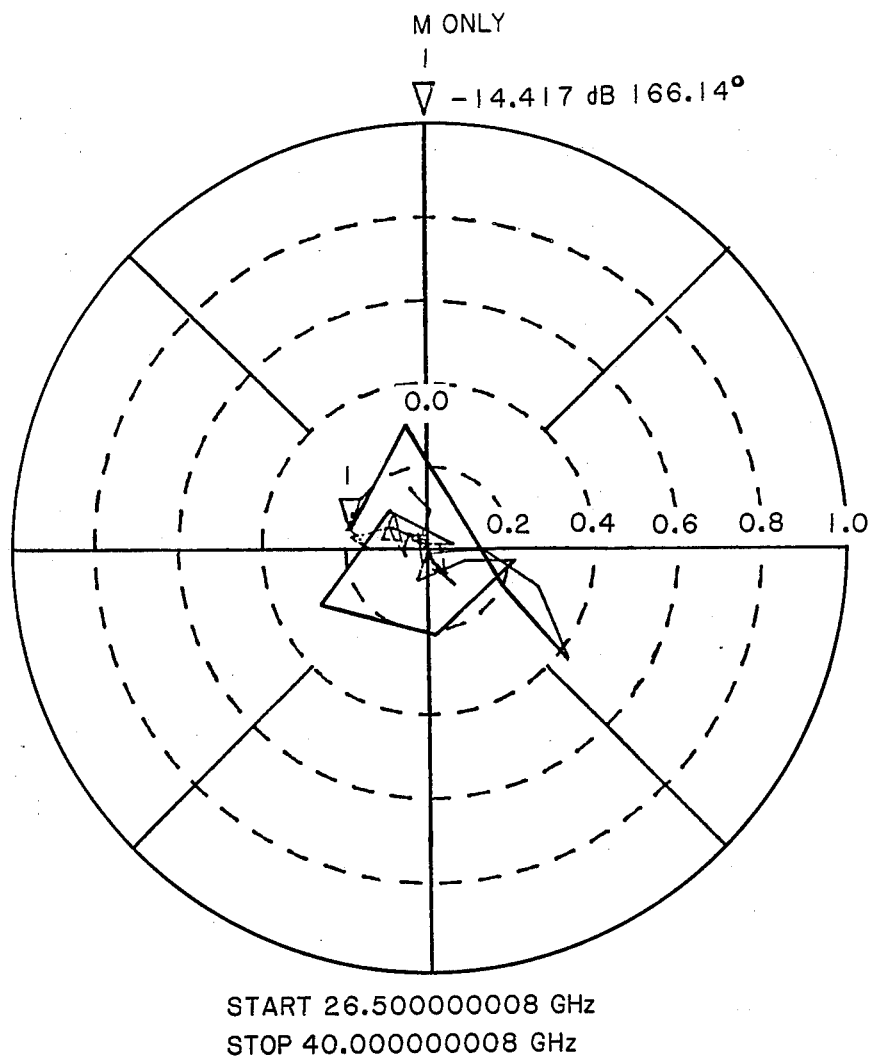
FIG. 5 is a polar representation indicating the corruption factor for a calibration procedure when using a sliding load to produce offset load conditions.

$K_{Cor}$ shows very strong correlation with non-correctable errors. For example, FIG. 4 shows $K_{Cor}$ for a calibration performed on the same vector network analyzer system as shown in FIG. 1 immediately after power turn-on, i.e., without allowing sufficient time for the instrument to stabilize. FIG. 5 illustrates the effect of connector repeatability on the corruption factor and is distinguished from FIG. 3 in that the offset loads were produced by using a micrometer adjustment on a sliding load instead of by way of waveguide shims.

Unlike conventional methods, information about corruption in the raw data is available by this invention immediately after data acquisition and does not require a calibration, i.e., determination of the error terms referred to above, to be completed. Thus, a user may reject an excessively corrupted data set by aborting a calibration run early in its cycle. In an automated environment, measurement throughput will thus be increased because of the early detection and rejection of corrupt data sets.

At this point, redundant measurement is exploited to obtain an algorithm with superior numerical stability and convergence properties even at relatively high corruption levels, a distinct advantage and improvement as it relates to use in connection with millimeter wave integrated circuit testing. The calibration method produces stable outputs, e.g., offset z, load reflection $\Gamma_L$, and the error coefficient terms, even though its inputs, namely the raw data, have fluctuations arising from corruption. Numerical stability is achieved by anticipation of the distribution of the raw data on a polar diagram plot and their susceptibility to corrupting influences from signal-to-noise considerations and recognizing that the calculations involve ratios of vector differences between the points that represent the raw data. Thus, vector differences between points that are closely spaced relative to the fluctuation in the position of those points will be very sensitive to those fluctuations and must be avoided. Using redundancy is key to providing the flexibility for such avoidance. Convergence is manifested by the agreement of the determined quantities with their actual or true values.

The equations represented by (2) and (3) can be used to eliminate all the E's and $\Gamma_L$, so that the relationship between the raw data and the offset z can be expressed as:

$$z^2 - C_z + 1 = 0 \qquad (9)$$

The constant C, in Equation 9, is a function of the raw data $C_{Sn}$ and $C_{Ln}$ and can be expressed as such, in a number of mathematically equivalent forms. However, because the raw data is corrupt, certain functional forms are preferred because they are less sensitive to corrupting influences. Accordingly, C is expressed as:

$$C = K_{LS}^{10}\left(1 + \frac{1}{K_S}\right)\left(1 + \frac{K_S}{K_{LS}^{20}}\right) - 2 \qquad (10)$$

where $$K_{LS}^{10} = \frac{C_{L1} - C_{S1}}{C_{L0} - C_{S0}} \qquad (11)$$

and the other constants have been defined previously. The expression for C in Eq. (10) has been derived in part by using Eq. (4) and the knowledge that $K_L$ as defined in Eq. (5) is more susceptible to corruption when $\Gamma_L$ is a load than are either $K_S$ or $K^{20}_{LS}$. This is one example of how redundant measurement is exploited as asserted above. Equation (9) can be solved to obtain the two roots, $z_+$ and $z_-$, where $$z_{\pm} = \frac{C \pm \sqrt{C^2 - 4}}{2} \qquad (12)$$

A number of important observations can be made regarding the roots. From the theory of quadratic equations, $$z_+ \cdot z_{31} = 1 \qquad (13)$$

and $$z_+ + z_{31} = C \qquad (14)$$

Figure 6:
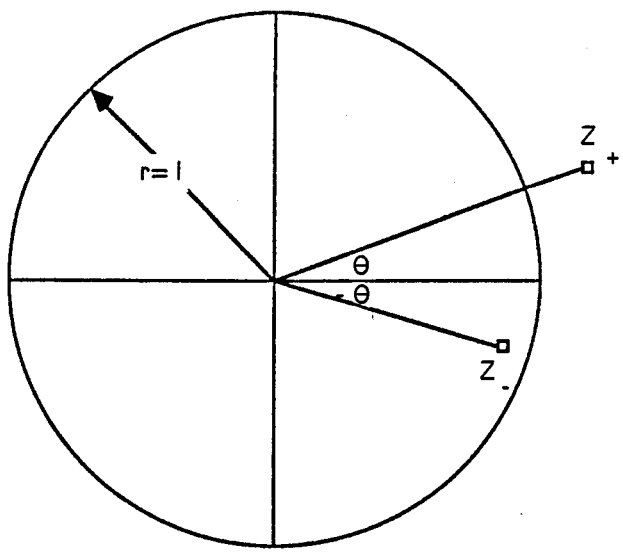
FIG. 6 is a unit circle diagram helpful in understanding the method according to the subject invention.

Equation (13) suggests that the two roots must be phase conjugate, or, more generally, arg $(z_+)$ + arg $(z_-)$ = $2m\zeta$, where m = 0,1,2,3,.... Also, if the magnitude of any one of the roots is greater than unity, the other root must have a magnitude less than unity. These conditions are illustrated in FIG. 6. According to Eq. (1), the root that corresponds to attenuation, due to line loss, has a magnitude greater than unity, and is therefore the correct root. In the absence of line loss, the two roots must have unit magnitude and be complex conjugates of each other. For this case, Eq. (14) implies that C is real. Thus, the imaginary part of C is a sensitive indicator of transmission line losses and also corruption. These conclusions, however, are not obvious from equation 10 for the expression for C.

Figure 7:
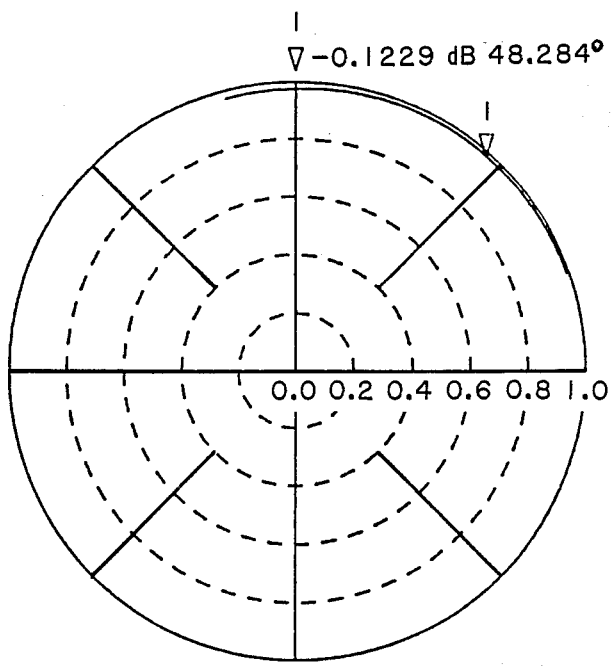
FIG. 7 is a polar representation of the magnitude and phase of an offset short calculated from the procedure.

Once z is determined, its reciprocal is the transformation factor for the single offset according to Eq. (1), and, in particular, $-z_-1$ represents the reflection of the offset short as displayed in FIG. 7, which represents the magnitude and phase of the offset short after the correct root is chosen.

Figure 8A:
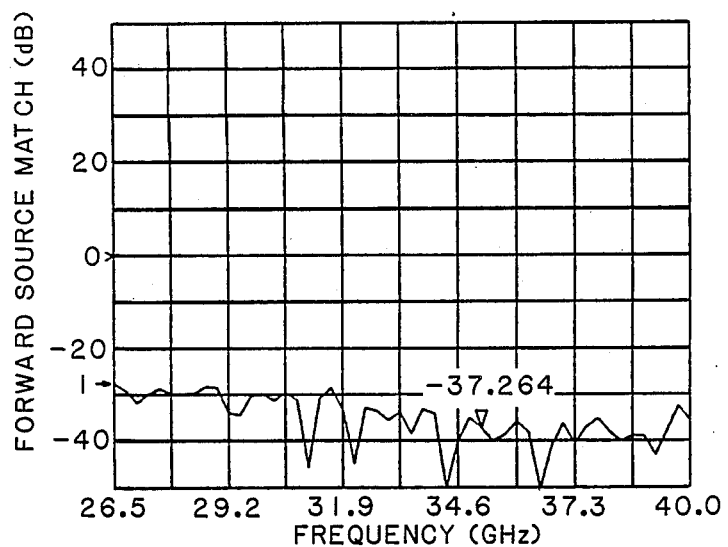
FIGS. 8A and 8B are characteristic curves illustrative of the magnitude and phase of a source match error coefficient obtained by the subject invention.
Figure 8B:
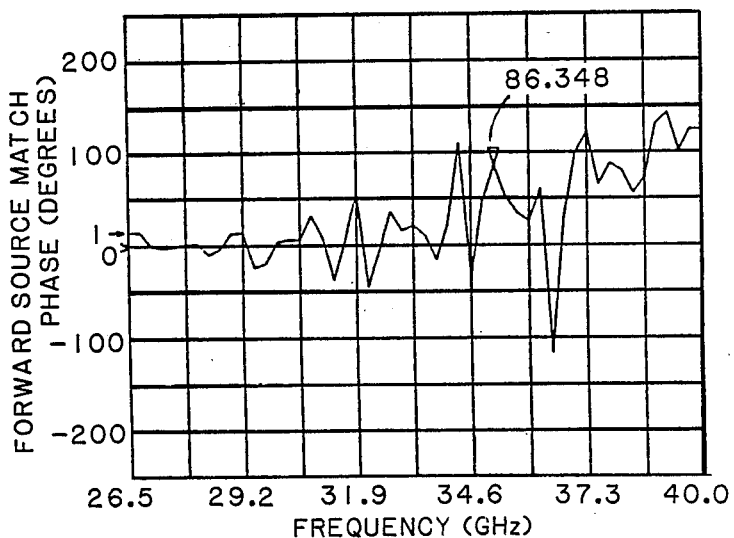

The source match error coefficient $E_S$ is next calculated from the previously determined z (Eq. 13), $K_s$ (Eq. 8), and the formula $$E_S = -\frac{z(1 - zK_S)}{z - K_S} \qquad (15)$$

derived from Eq. (2). The result is displayed in FIGS. 8a and 8b which disclose the magnitude and phase of the source match.

Figure 9A:
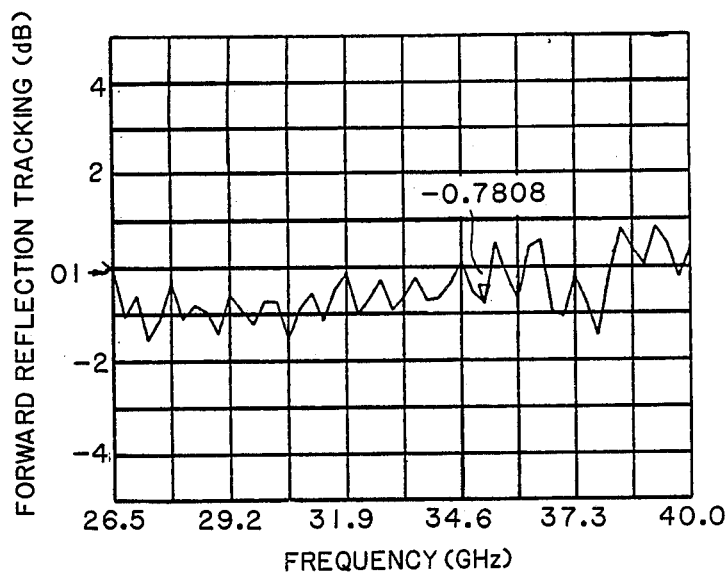
FIG. 9A and 9B are characteristic curves illustrative of the magnitude and phase of a reflection tracking coefficient obtained by the subject invention.
Figure 9B:
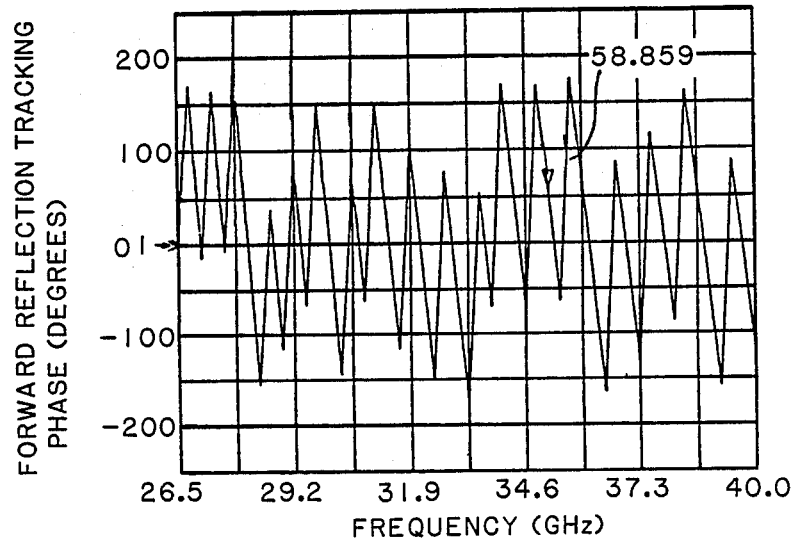

Eq. (2) may be manipulated to derive the reflection tracking error coefficient $E_R$ which can be expressed as:

$$E_R = \frac{(1 + E_S)(z + E_S)(C_{S1} - C_{S0})}{z - 1} \qquad (16)$$

and is shown in FIGS. 9a and 9b.

Figure 10A:
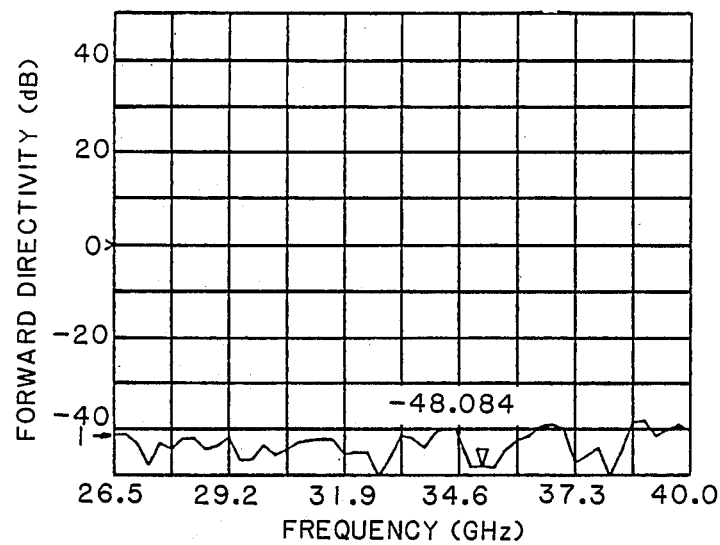
FIGS. 10A and 10B are characteristic curves illustrative of the magnitude and phase of a directivity error coefficient obtained by the subject invention.
Figure 10B:
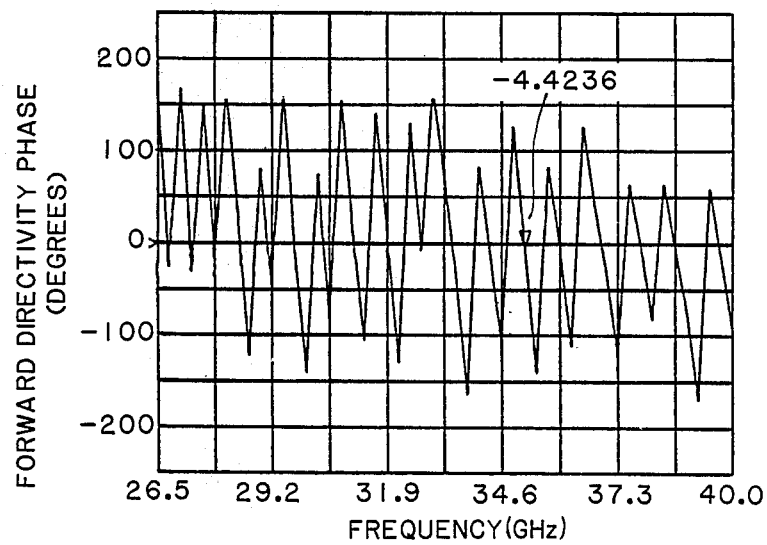

Next, the directivity error coefficient, $E_D$, may be obtained from Eq. (2) with n=0, as:

$$E_D = C_{S0} + \frac{E_R}{1 + E_S} \qquad (17)$$

and is illustrated in FIGS. 10a and 10b.

Once the error coefficients $E_S$, $E_R$ and $E_D$ are determined, the reflection coefficient $\Gamma_L$ of the load can be determined from Eq. (3) with n=0, as:

$$\Gamma_L = \frac{(C_{L0} - E_D)}{(C_{L0} - E_D)E_S + E_S} \qquad (18)$$

Figure 11A:
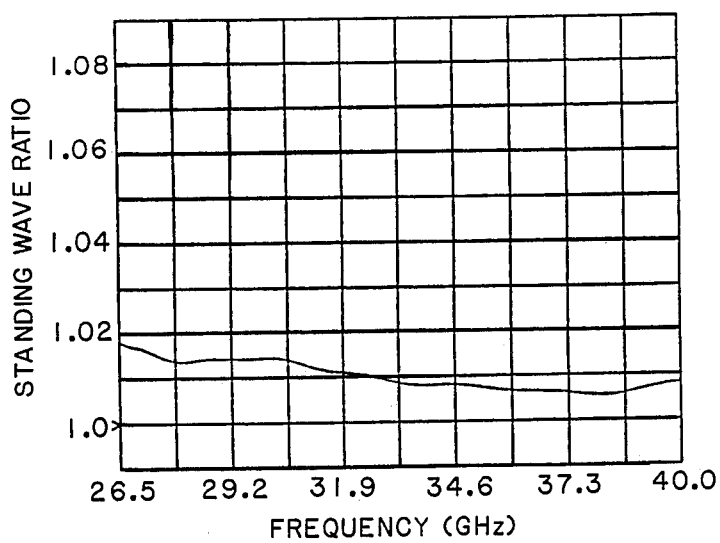
FIGS. 11A and 11B are characteristic curves illustrative of the standing wave ratio and return loss representation of a reflection coefficient obtained by the subject invention.
Figure 11B:
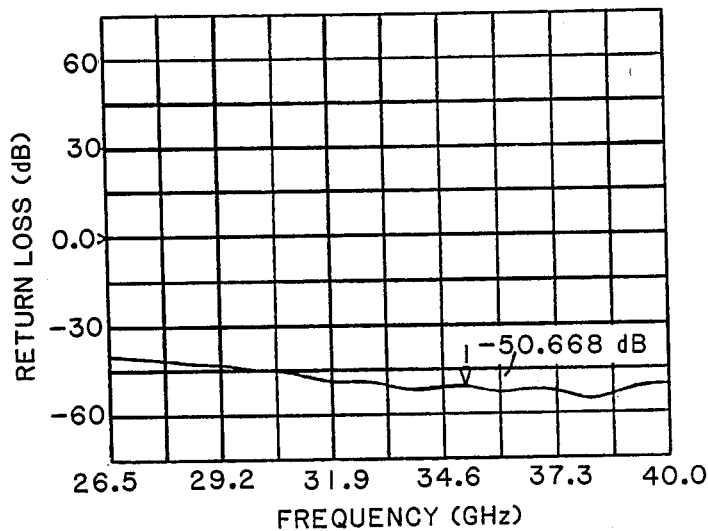

The load reflection is shown in the standing wave ratio and return loss curves of FIGS. 11a and 11b, respectively.

Up to this point, all of the primary parameters have been determined, namely, the errors terms, the reflection coefficient of the load $\Gamma_L$, and the offset z, and $K_{Cor}$ has provided a measure of the corruption in the calibration process. However, the relationship between the displayed value of corruption, $K_{Cor}$ and confidence in the calibration procedure has not yet been established.

Because there are six measurement conditions, the obvious verification strategy would be to use any five of them to determine the unknowns identified above, and the sixth relation to verify the calibration. However, such an algorithm is practical only for highly sanitized raw data. Greater numerical stability of the algorithm results from developing the error terms described above and using the approach now to be described.

Any number of the six measurement conditions may be used to assess the effect of the corruption factor, $K_{Cor}$ on the calibration. Because the reflection coefficient of the load $\Gamma_L$ and offset z are outputs of the procedure, the offset short and the load measurement are recommended for the assessment, thus allowing the effect of $K_{Cor}$ to be determined at the two extremes of the dynamic range of the measuring apparatus.

Equation (4) becomes a starting point for making assessments of corrupting influences on all terminations. In particular, it can be used to solve for the raw data of the load termination, i.e., $C_{LO}$, in terms of the other raw data. The result is $$C_{L0} = \frac{C_{L1} + \frac{(C_{L2} - C_{L1})}{(C_{L2} - C_{S2})} K_S C_{S0}}{1 + \frac{(C_{L2} - C_{L1})}{(C_{L2} - C_{S2})} K_S} \quad (19)$$

The equality of Eq. (19) holds only in the absence of non-systematic (i.e., corrupting) influences. The right-hand side of equation 19 may therefore be viewed as an alternate representation of $C_{LO}$, which approaches the actual measured raw coefficient in the limit of zero corruption. Thus, both sides of Eq. (19) can be substituted in Eq. (18) to determine the corresponding $\Gamma_L$. On the HP 8510A, vector analyzer 10 (FIG. 1) the value of $\Gamma_L$ corresponding to the right-hand side of Eq. (19) is stored in memory and the actual load reflection (left-hand side) is viewed as data after the correction is applied. This procedure is executed with the load connected.

Figure 12:
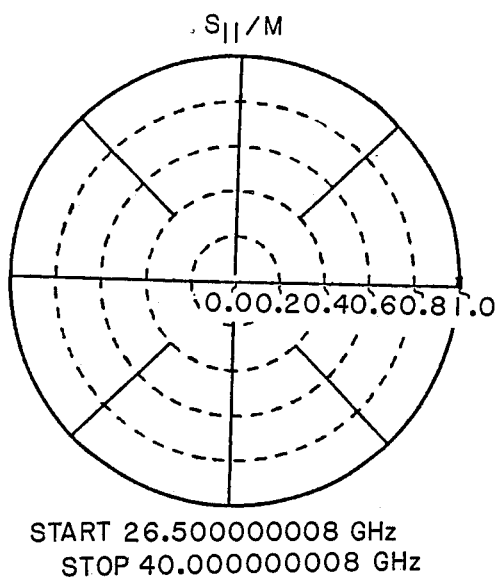
FIG. 12 is a polar representation of the impact of corruption on a reflection coefficient obtained by the subject invention.
Figure 13:
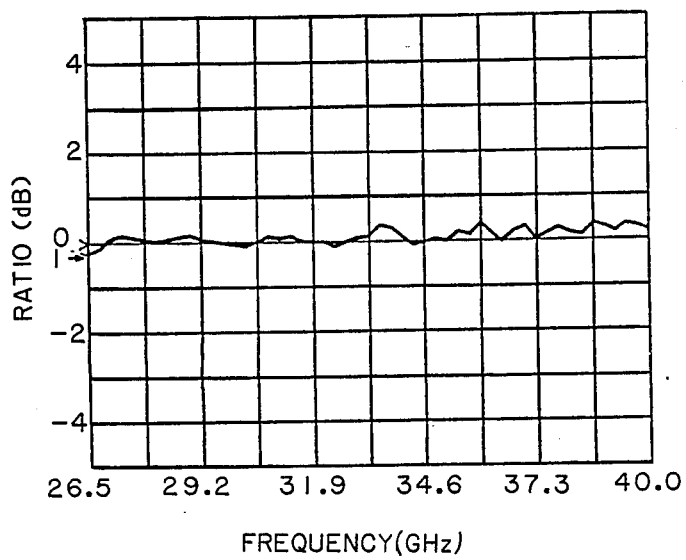
FIG. 13 is an illustrative curve of the impact of corruption shown in a log magnitude format on a reflection coefficient obtained by the subject invention.
Figure 14:
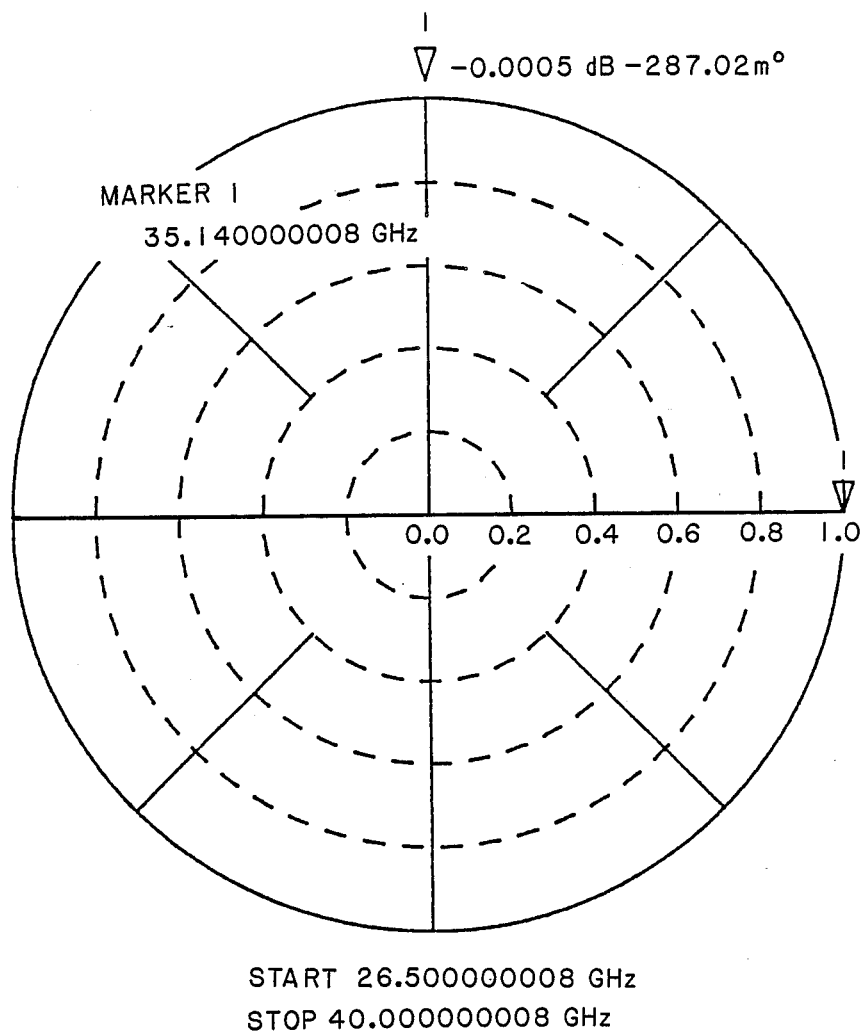
FIG. 14 is a polar representation similar to FIG. 12 and being illustrative of the impact of corruption on an offset short connected to the apparatus of FIG. 1.

A very sensitive indication of the impact of corruption is now obtained by dividing the two values of $\Gamma_L$. In the absence of corruption, the resulting display is a single point located at (1, 0) on a polar display. Corruption will cause "smearing" of the point as FIG. 12 illustrates for an actual load verification; FIG. 13b presents the data of FIG. 12 in log magnitude format, and FIG. 11 shows the actual return loss. The agreement is within ± 0.5 dB for a return loss in excess of 35 dB over the entire Ka band.

The same procedure could be applied to an offset short. However, an alternate method is available based on the calculated offset z since the offset short can be represented by the left and right hand sides of the equality:

$$-z^{-1} = \frac{C_{S1} - E_D}{(C_{S1} - E_D)E_S + E_R} \quad (20)$$

which holds true when corruption is absent. Alternatively, the value of the offset short can be evaluated by substituting its raw measurement $C_{S1}$ and the computed error terms (Eqs. 15 through 18), into Eq. (2) with n=1, and comparing the resulting estimate with the previous representation. On dividing one by the other, a single point results (FIG. 13) in close proximity to (1, 0). In practice, the trace ratios are always less than ±0.005 dB (0 dB in a perfect system) in magnitude, and the angular elevation from the real axis is less that ±0.8° (0° in a perfect system). Better phase stability will be obtained if the ambient temperature is controlled. In the same manner, a comparison can be made for a doubly offset short by testing for the equality as represented by the expression:

$$-z^{-2} = \frac{C_{S2} - E_D}{(C_{S2} - E_D)E_s + E_R} \quad (21)$$

and for a simple short with no offset it can be determined by testing the equality.

$$-1 = \frac{C_{S0} - E_D}{(C_{S0} - E_D)E_R - E_R} \quad (22)$$

Thus the corrupting influences can be determined by testing the equalities as expressed in equations (20, 21 and 22).

Comparing the ±0.5 dB uncertainty (FIG. 12) for the load measurement with the ±0.005 dB uncertainty (FIG. 13) for the short indicates that corruption has less influence on the short than on the load. This is to be expected if the chief corrupting influence is connection interface non-reproducibility. In practical measurement situations, discontinuities at the interconnect will produce small reflection amplitudes that will have a more pronounced influence on the low-level reflection emanating from a load than on the much larger reflection signal returned by the short. Nevertheless, this verification step for the offset short is strongly recommended for detecting gross operator-induced flaws during calibration.

Although an algorithm for assessing the effect of $K_{Cor}$ on the calibration has been described, this specification is incomplete without a comparison of the calibration's outputs with the true values of the corresponding quantities, e.g., how close the offset is to its "true" value. In the foregoing example where a calibration is implemented in WR-28 rectangular waveguide using the dominant $TE_{10}$ mode, standard waveguide theory may be used to predict the true value of offset at each frequency. For an actual calibration run utilizing a system such as shown in FIG. 1, the calculated offset values are 104.1° at 26.5 GHz and 20° at 40 GHz for the particular offset length (1.956 mm for the smaller offset) used, while the corresponding measured values (FIG. 5) are 103.89° and 19.3°, respectively. In actual experience, measured deviations were smaller than 3° even when $K_{Cor}$ was relatively large.

Thus, the method of the subject invention involves: (a) acquiring and storing raw data for the measurement conditions involving at least one known standard such as a short and its associated combinations of an offset short and doubly offset short and an unknown standard differing from the known standard such as a load, offset load, and a doubly-offset load; (b) determining, by means of software the corruption factor $K_{Cor}$ in accordance with equation (8) and the factors of the raw data expressed in equations (5) through (7); (c) determining the offset z from equation (9) taking into account the factors expressed in equations (4), (10) and (11); (d) finding the roots of the offset z in accordance with equation (12) which will provide an offset value for z; (e) calculating the source match, $E_S$, from equation (15); (f) calculating the reflection tracking coefficient, $E_R$, in accordance with equation (16); (g) calculating the directivity, $E_D$, in accordance with equation (17); (h) calculating the reflection coefficient, $\Gamma_L$, in accordance with equation (18); (i) determining the corrupting influences on all terminations particularly the load termination $C_{LO}$ in accordance with equation (19); and (j) and displaying the results on the network analyzer as set forth.

There are significant benefits to having a calibration procedure in which the load, $\Gamma_l$, does not need to be known a priori. For example, one may use the device on which measurement is ultimately desired (and for which the instrument is being calibrated in the first place) as the "load". The procedure will then determine its reflection coefficient. Another significant example is one where the return port, i.e. port 2 of FIG. 1 is used in place of $\Gamma_L$. In this case, the load match error term, $E_L$, is determined by the method set forth above. The other two-port error terms may be obtained by combining this technique with other conventional methods.

Having shown and described what is at present considered to be the preferred method calibration, it should be known that the same has been made by way of illustration and not limitation. Accordingly, all modifications, alterations and variations coming within the spirit and scope of the invention as set forth in the appended claims are meant to be included.

We claim:

1. A method for calibrating measurement apparatus including a vector network analyzer for making evaluations of circuits operating at microwave and millimeter wave frequencies comprising the steps of:
   (a) measuring and storing data for a plurality of measurement conditions utilizing a first standard termination, alone and in combination with a pair of termination offsets having respective lengths defining a predetermined ratio;
   (b) measuring and storing data for a plurality of measurement conditions utilizing a second standard termination different from the first standard termination, alone and in combination with said pair of offsets as set forth in step (a);
   (c) computing a figure of merit of the quality of the measured raw data measured in steps (a) and (b);
   (d) computing the electrical length of the offsets expressed as a function of the wavelength used in steps (a) and (b);
   (e) computing a plurality of error terms also known as error coefficients based on a predetermined error model;
   (f) computing the reflection coefficient of the second standard; and
   (g) determining the corrupting influences on said terminations by comparing the computed values as obtained in steps (d) and (f) with corresponding measured values obtained in steps (a) and (b).

2. The method as defined by claim 1, wherein the first standard comprises a short circuit, an open circuit, or a termination with known but arbitrary response.

3. The method as defined by claim 1 wherein the second standard comprises a load, a short circuit, an open circuit, or other termination with unknown and arbitrary response different from the response of said known standard.

4. The method as defined by claim 1 wherein said offsets are comprised of waveguide shims and have a ratio of 2:1.

5. The method as defined by claim 1 wherein said step (c) comprises the step of computing the corruption factor $K_{Cor}$ of the raw data.

6. The method as defined by claim 1 wherein said step (e) comprises the step of computing the parameter including frequency response tracking, $E_R$, directivity, $E_D$, and selectively source match, $E_S$, and load match, $E_L$.

7. The method as defined by claim 6 wherein said step (e) additionally includes the step of computing the parameters including isolation, $E_X$, and transmission tracking, $E_T$.

8. The method as defined by claim 1 wherein said step (c) comprises the step of computing the corruption factor $K_{Cor}$ according to the expression:

$$K_{COR} = K_L - \frac{K_{LS}^{20}}{K_S}$$

where $$K_L = \frac{C_{L2} - C_{L1}}{C_{L1} - C_{L0}}$$

$$K_{LS}^{20} = \frac{C_{L2} - C_{S2}}{C_{L0} - C_{S0}}$$

and $$K_S = \frac{C_{S2} - C_{S1}}{C_{S1} - C_{S0}}$$

where $C_{S0}$, $C_{S1}$, $C_{S2}$, $C_{L0}$ and $C_{L2}$ comprises measured data values of the reflection coefficients for a short, offset short, doubly offset short, a load, offset load, and doubly offset load, respectively.

9. The method as defined by claim 8 and additionally including the step of computing the parameter defined as the offset z from the roots $Z+$ of the expression:

$$[z^2 - Cz + 1 = 0]$$

$$z_\pm = C \pm \sqrt{C^2 - 4} \ /2$$

where $$C = K_{LS}^{10}\left(1 + \frac{1}{K_s}\right)\left(1 + \frac{K_s}{K_{LS}^{20}}\right) - 2$$

and $$K_{LS}^{10} = \frac{C_{L1} - C_{S1}}{C_{L0} - C_{S0}}$$

10. The method as defined by claim 8 and wherein said step (g) of determining corrupting influences includes the step of comparing, for an offset short $(-Z^{-1})$, the computed and measured value of a parameter defined by expression $$-z^{-1} = \frac{C_{S1} - E_D}{(C_{S1} - E_D)E_S + E_R}$$

11. The method as defined by claim 9 and wherein said step (e) includes the step of computing the parameter source match, $E_S$, according to the expression:

$$E_S = \frac{z(1 - zK_S)}{z - K_s}$$

12. The method as defined by claim 11 wherein said step (e) includes the step of computing the reflection tracking error coefficient, $E_R$, according to the expression:

$$E_R = \frac{(1 + E_S)(z + E_S)(C_{S1} - C_{S0})}{z - 1}$$

13. The method as defined by claim 12 wherein said step (e) includes the step of computing the directivity error coefficient, $E_D$, according to the expression:

$$E_D = C_{S0} + \frac{E_R}{1 + E_S}$$

14. The method as defined by claim 13 and wherein said step (f) comprises the step of computing the reflection coefficient $\Gamma_L$, in accordance with expression:

$$\Gamma_L = \frac{(C_{L0} - E_D)}{(C_{L0} - E_D)E_S + E_R}$$

15. The method as defined by claim 14 wherein said step (g) of determining corrupting influences additionally includes the step of computing the parameter $C_{L0}$ of the load termination in accordance with the expression:

$$C_{L0} = \frac{C_{L1} + \dfrac{(C_{L2} - C_{L1})}{(C_{L2} - C_{S2})} K_S C_{S0}}{1 + \dfrac{(C_{L2} - C_{L1})}{(C_{L2} - C_{S2})} K_S}$$

and by using both sides of this equation obtaining estimates of $\Gamma_L$ as set forth in step (f), and thereafter comparing the two estimates.

16. The method as defined by claim 10 wherein said step (g) of determining corrupting influences includes the step of comparison, for a simple short ($-1$) with no offset, the computed and measured value of a parameter defined by the expression:

$$-1 = \frac{(C_{S0} - E_D)}{(C_{S0} - E_D)E_S + E_R}$$

17. The method as defined by claim 10 and wherein said step (g) of determining corrupting influences includes the step of comparing for a doubling offset short ($-Z^{-2}$), the computed and measured value of a parameter defined by the expression $$-Z^{-2} = \frac{C_{S2} - E_D}{(C_{S2} - E_D)E_S + E_R}$$

* * * * *